US009370090B2

(12) United States Patent
Chauhan et al.

(10) Patent No.: US 9,370,090 B2
(45) Date of Patent: Jun. 14, 2016

(54) CIRCUIT CARD ASSEMBLY AND METHOD OF MANUFACTURING THEREOF

(71) Applicant: General Electric Company, Schenectady, NY (US)

(72) Inventors: Shakti Singh Chauhan, Guilderland, NY (US); Stuart Connolly, Northampton (GB); Binoy Milan Shah, Niskayuna, NY (US); Brian Hoden, Huntsville, AL (US); Joo Han Kim, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 47 days.

(21) Appl. No.: 14/500,530

(22) Filed: Sep. 29, 2014

(65) Prior Publication Data

US 2016/0095199 A1    Mar. 31, 2016

(51) Int. Cl.
*H05K 7/20* (2006.01)
*H05K 1/02* (2006.01)
*H05K 1/18* (2006.01)
(Continued)

(52) U.S. Cl.
CPC .............. *H05K 1/0204* (2013.01); *H05K 1/181* (2013.01); *H05K 3/30* (2013.01); *H05K 3/368* (2013.01); *H05K 7/20309* (2013.01); *H05K 7/20318* (2013.01); *H05K 7/20336* (2013.01)

(58) Field of Classification Search
CPC . H05K 7/20; H05K 7/20672; H05K 7/20572; H05K 7/20809; G06F 1/18; G06F 1/20; G06F 1/203; H01L 23/427; H01L 23/473; F28D 15/02; F28F 3/02
USPC ............... 361/679.46–679.55, 688, 689, 698, 361/699, 700–712, 714, 715, 719–724; 165/80.2, 80.3, 80.4, 80.5, 104.19, 165/104.21, 104.26, 104.33, 104.34, 185; 257/706–727; 174/15.1, 15.2, 15.3, 174/16.3
See application file for complete search history.

(56) References Cited

U.S. PATENT DOCUMENTS 5,283,715 A   2/1994   Carlsten et al.
6,148,906 A   11/2000  Li et al.
(Continued)

FOREIGN PATENT DOCUMENTS

EP    2061296 A1    5/2009

OTHER PUBLICATIONS

Oshman et al., The Development of Polymer-Based Flat Heat Pipes, Microelectromechanical Systems, Journal of IEEE Explore, Apr. 2011, vol. 20, Issue 2, pp. 410-417.

(Continued)

*Primary Examiner* — Michail V Datskovskiy
(74) *Attorney, Agent, or Firm* — Nitin N. Joshi

(57) ABSTRACT

A circuit card assembly is provided. The assembly includes a first printed circuit board, at least one electronic component mounted on the first printed circuit board at a predetermined location, a frame coupled to the first printed circuit board, and a heat transfer assembly coupled to the frame. The heat transfer assembly includes a first plate extending over at least a portion of the first printed circuit board, a heat pipe coupled to the first plate, and a thermally conductive member positioned between the at least one electronic component and the heat pipe. The thermally conductive member is selectively mounted at predetermined locations along the first plate based on the predetermined location of the at least one electronic component.

20 Claims, 6 Drawing Sheets

(51) Int. Cl.
*H05K 3/30* (2006.01)
*H05K 3/36* (2006.01)
*G06F 1/20* (2006.01)

(56) References Cited

U.S. PATENT DOCUMENTS

| | | | |
|---|---|---|---|
| 6,397,935 B1 | 6/2002 | Yamamoto et al. | |
| 6,621,713 B2 * | 9/2003 | Amaike | G06F 1/18 174/15.2 |
| 6,679,318 B2 | 1/2004 | Bakke | |
| 6,839,235 B2 * | 1/2005 | St. Louis | H05K 7/20672 165/104.33 |
| 7,397,662 B2 * | 7/2008 | Oyamada | H05K 7/20572 165/80.4 |
| 7,589,962 B1 | 9/2009 | Bhatia | |
| 7,626,820 B1 * | 12/2009 | Konshak | H05K 7/20672 165/104.33 |
| 8,159,819 B2 * | 4/2012 | Memon | G06F 1/20 165/185 |
| 8,223,494 B2 * | 7/2012 | Bult | H05K 7/1404 165/104.33 |
| 8,542,485 B2 * | 9/2013 | Nemoz | H05K 7/20672 361/690 |
| 8,570,749 B2 * | 10/2013 | Tissot | H05K 7/20809 174/548 |
| 2002/0135980 A1 | 9/2002 | Vafai | |
| 2010/0259899 A1 * | 10/2010 | Facusse | H05K 7/20809 361/709 |
| 2011/0182033 A1 * | 7/2011 | Tissot | H05K 7/20672 361/700 |
| 2012/0085520 A1 * | 4/2012 | Pfaffinger | H01L 23/427 165/104.26 |
| 2014/0166244 A1 | 6/2014 | Dai et al. | |
| 2014/0182817 A1 | 7/2014 | Yu | |

OTHER PUBLICATIONS

Harmand et al., Transient Cooling of Electronic Components by Flat Heat Pipes, Applied Thermal Engineering, Science Direct, Aug. 2011, vol. 31, Issues 11-12, pp. 1877-1885.

European Search Report and Written Opinion issued in connection with corresponding EP Application No. 15187171.2-1803 dated Mar. 15, 2016.

* cited by examiner

CIRCUIT CARD ASSEMBLY AND METHOD OF MANUFACTURING THEREOF

BACKGROUND

The present disclosure relates generally to electronics systems and, more specifically, to circuit card assemblies and systems and methods of dissipating heat therefrom.

Most modern electronics systems function using at least one circuit card assembly. At least some known circuit card assemblies include a printed circuit board on which at least one electronic component, such as a processor, is mounted. Because electronic components generate heat during operation of electronics systems, it is generally desirable to actively cool the electronic components to ensure they continue to function properly. However, space limitations in known circuit card assemblies generally limit the size of heat dissipation mechanisms that are used to transfer heat from the electronic components. Moreover, a configuration of the electronic components mounted on the printed circuit board can vary based on the functionality of the circuit card assembly. As such, it is generally difficult to customize generic heat dissipation mechanisms to enhance heat transfer from the electronic components when the configuration of the electronic components is unknown.

BRIEF DESCRIPTION

In one aspect, a circuit card assembly is provided. The assembly includes a first printed circuit board, at least one electronic component mounted on the first printed circuit board at a predetermined location, a frame coupled to the first printed circuit board, and a heat transfer assembly coupled to the frame. The heat transfer assembly includes a first plate extending over at least a portion of the first printed circuit board, a heat pipe coupled to the first plate, and a thermally conductive member positioned between the at least one electronic component and the heat pipe. The thermally conductive member is selectively mounted at predetermined locations along the first plate based on the predetermined location of the at least one electronic component.

In another aspect, an electronics system is provided. The electronics system includes a chassis and a circuit card assembly coupled to the chassis. The assembly includes a first printed circuit board, at least one electronic component mounted on the first printed circuit board at a predetermined location, a frame coupled to the first printed circuit board, and a heat transfer assembly coupled to the frame. The heat transfer assembly includes a first plate extending over at least a portion of the first printed circuit board, a heat pipe coupled to the first plate, and a thermally conductive member positioned between the at least one electronic component and the heat pipe. The thermally conductive member is selectively mounted at predetermined locations along the first plate based on the predetermined location of the at least one electronic component.

In yet another aspect, a method of manufacturing a circuit card assembly is provided. The method includes coupling a frame to a first printed circuit board including at least one electronic component mounted thereon at a predetermined location, and coupling a heat transfer assembly to the frame. The heat transfer assembly includes a first plate extending over at least a portion of the first printed circuit board. The method also includes selectively mounting a thermally conductive member at predetermined locations along the first plate based on the predetermined location of the at least one electronic component.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

Embodiments of the present disclosure relate to circuit card assemblies having improved thermal performance over other known alternatives. In the exemplary embodiment, the circuit card assembly includes a heat transfer assembly that reduces resistance to heat transfer away from heat generating electronic components mounted on a printed circuit board. Specifically, the heat transfer assembly implements a plurality of heat dissipation mechanisms such as: a) a modular thermally conductive member; b) improved heat pipe configurations; and c) a plate custom fit to components extending from the printed circuit board. The heat dissipation mechanisms may be used either alone or in combination to improve the thermal performance of the circuit card assembly. As such, improving the thermal performance of the circuit card assembly facilitates enabling a processor or other electronic components having an increased power output to be mounted on the printed circuit board.

Figure 1:
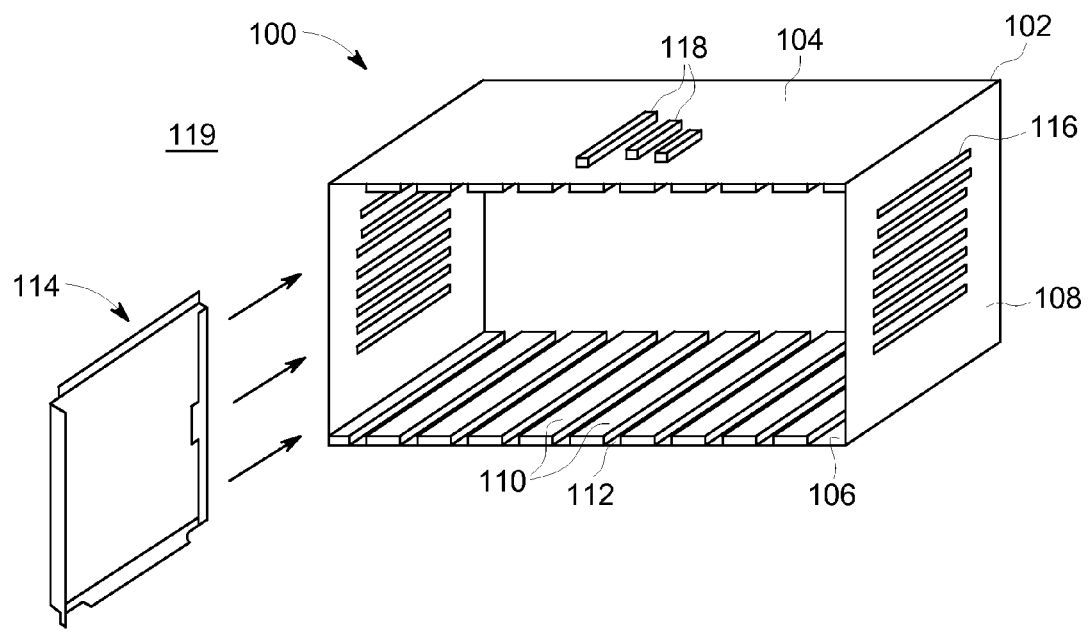
FIG. 1 is a perspective view of an exemplary chassis.

FIG. 1 is a perspective view of an exemplary chassis 100. In the exemplary embodiment, chassis 100 includes a housing 102 having a top wall 104, a bottom wall 106, and a pair of side walls 108. Each of top wall 104 and bottom wall 106 includes a plurality of spaced-apart rails 110 such that a slot 112 is defined between adjacent rails 110. Each slot 112 defined along top wall 104 is substantially aligned with a corresponding slot 112 defined along bottom wall 106 such that a circuit card assembly (CCA) 114 is slidably receivable therein. Housing 102 also includes a vent 116 that facilitates channeling air through housing 102, and a plurality of external fins 118 that facilitate convective heat transfer from housing 102 to an ambient environment 119. In an alternative embodiment, housing 102 may include a front wall and a back wall such that CCA 114 is completely enclosed within housing 102.

Figure 2:
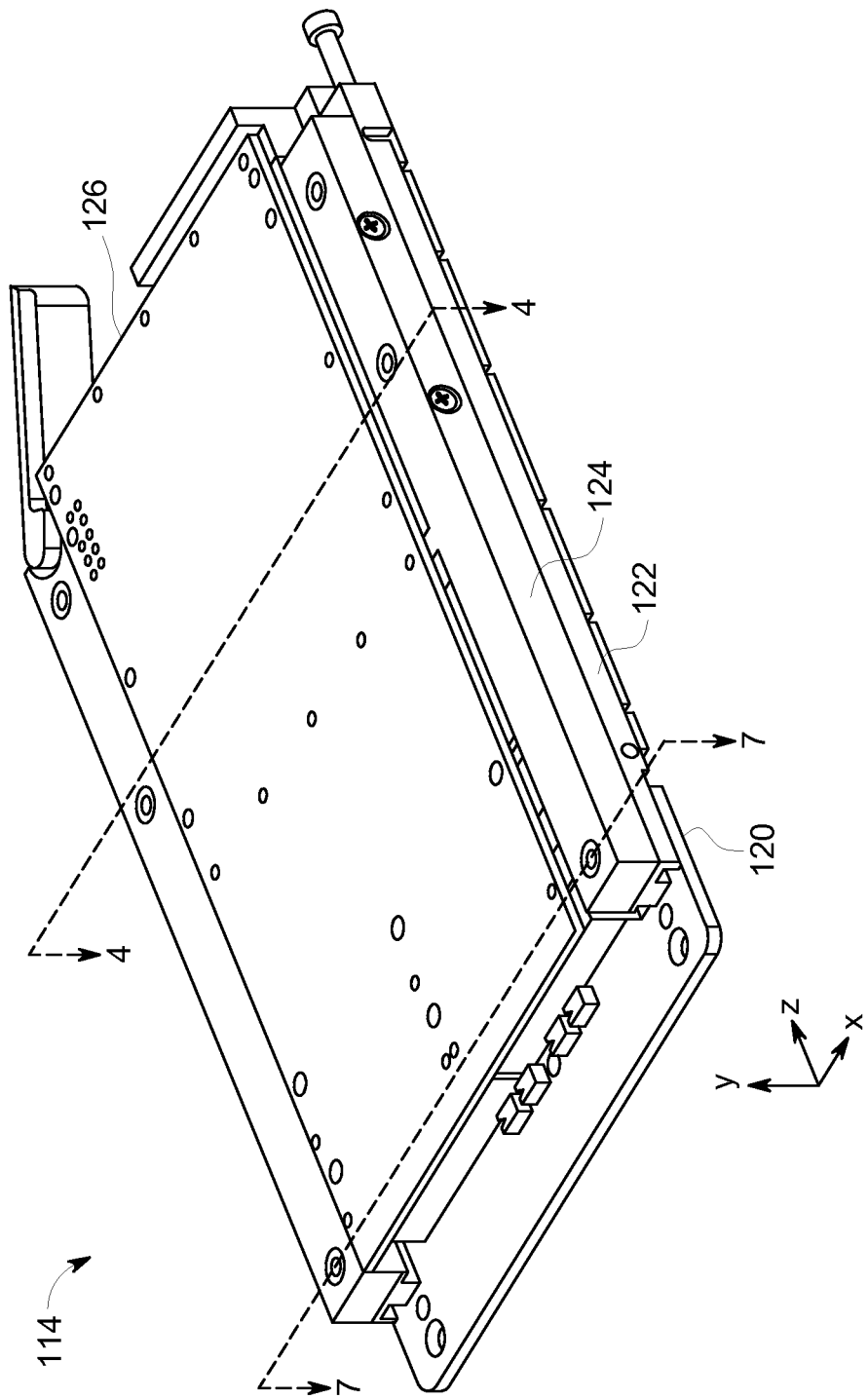
FIG. 2 is a perspective view of an exemplary circuit card assembly.
Figure 3:
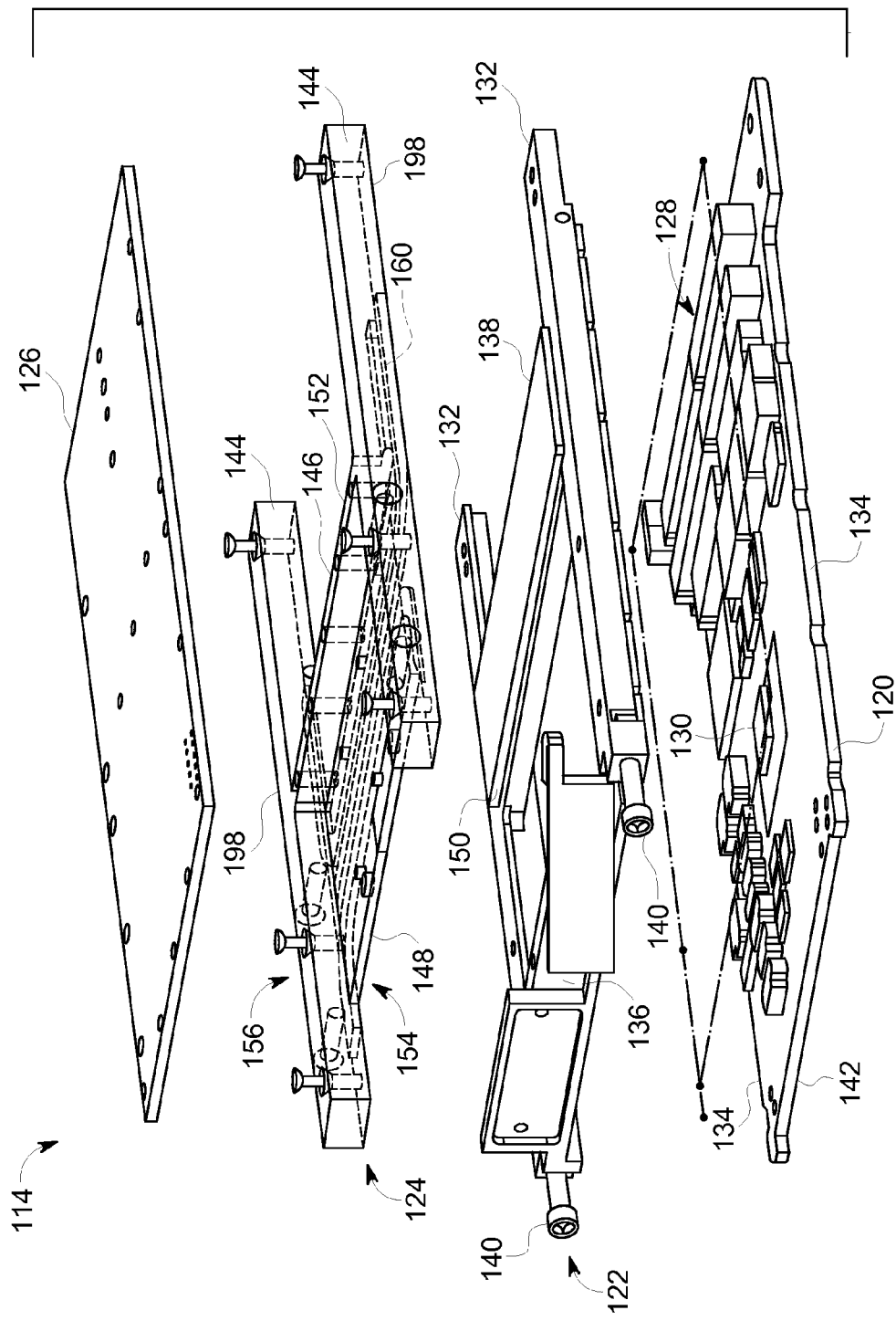
FIG. 3 is an exploded view of the circuit card assembly shown in FIG. 2.

FIG. 2 is a perspective view of CCA 114, and FIG. 3 is an exploded view of CCA 114. X, Y, and Z axes are also shown in FIG. 2 to provide clarity in the current description. In the exemplary embodiment, CCA 114 includes a first printed circuit board (PCB) 120, a frame 122 coupled to first PCB 120, a heat transfer assembly 124 coupled to frame 122, and a second PCB 126 coupled to heat transfer assembly 124. A plurality of electronic components 128 are mounted on first PCB 120 via a solder attachment (not shown), for example. At least one of components 128 is a processor 130. Components 128 are mounted on first PCB 120 in any configuration that enables CCA 114 to function as described herein. For example, the number, placement, and/or type of components 128 mounted on first PCB 120 is based on the desired functionality of CCA 114.

Frame 122 includes a pair of first side rails 132 that extend along side edges 134 of first PCB 120, and a first support rail 136 and a second plate 138 extending between the pair of first side rails 132. Frame 122 also includes a wedge lock mechanism 140 extending from each of first side rails 132. Wedge lock mechanism 140 ensures CCA 114 remains securely positioned with corresponding slots 112 when CCA 114 is inserted within chassis 100 (shown in FIG. 1). Moreover, as will be described in more detail below, second plate 138 extends over at least some components 128 mounted on first PCB 120, and a shape of second plate 138 is selected as a function of a distance that components 128 extend from a first surface 142 of first PCB 120 along a Y-axis (shown in FIG. 2). More specifically, components 128 extend from first surface 142 and couple to second plate 138. As such, in some embodiments, frame 122 is fabricated from a thermally conductive material that facilitates transferring heat from the at least some components 128 to heat transfer assembly 124.

Heat transfer assembly 124 includes a pair of second side rails 144, and a second support rail 146 and a first plate 148 extending between the pair of second side rails 144 and over at least a portion of first PCB 120. A top edge 150 of second plate 138 substantially aligns with a bottom edge 152 of second support rail 146 such that second plate 138 and second support rail 146 are in intimate contact when CCA 114 is assembled. As such, heat can be transferred from components 128, through second plate 138, and towards heat transfer assembly 124 via second support rail 146. Moreover, second PCB 126 is coupled to first and second support rails 132 and 144 when CCA 114 is assembled. As such, first PCB 120 is positioned on a first side 154 of heat transfer assembly 124 and second PCB 126 is positioned on a second side 156 of heat transfer assembly 124. In one embodiment, first side 154 is generally hotter than second side 156 as a result of being positioned adjacent to heat generating components 128 mounted on first PCB 120.

Heat transfer assembly 124 also includes at least one secondary rail 158 positioned between second PCB 126 and first plate 148, a plurality of heat pipes 160 coupled to first plate 148, and a thermally conductive member 162 positioned between components 128 and heat pipes 160. Secondary rail 158 facilitates transferring heat from electronic components (not shown in FIG. 3) mounted on second PCB 126 towards first plate 148. In one embodiment, thermally conductive member 162 is positioned between processor 130 and heat pipes 160. As will be described in more detail below, thermally conductive member 162 is selectively mounted at predetermined locations along first plate 148 based on a location of processor 130 mounted on first PCB 120.

First plate 148 is fabricated from any material that enables heat transfer assembly 124 to function as described herein. For example, in one embodiment, first plate 148 is fabricated from a thermally conductive material such as aluminum, copper, or magnesium. In such embodiments, heat pipes 160 may be omitted such that heat generated by processor 130 is conducted directly through first plate 148. In an alternative implementation, first plate 148 may be fabricated from a substantially non-thermally conductive material such as carbon fiber reinforced polymer, and heat pipes 160 facilitate transferring a majority of heat from processor 130 when compared to the heat transferred by first plate 148. As such, the heat transfer capability of heat transfer assembly 124 is substantially maintained and the weight of this alternative CCA is reduced when compared to a CCA 114 having a heat pipe-embedded first plate 148 fabricated from thermally conductive material.

Thermally conductive member 162 is fabricated from any material that enables heat transfer assembly 124 to function as described herein. For example, in one embodiment, thermally conductive member is fabricated from a rigid thermally conductive material such as aluminum, copper, or magnesium. Alternatively, thermally conductive member 162 is fabricated from flexible material such as a gap pad, or a flexible mechanism including nanosprings such as a thermal bridge.

Figure 4:
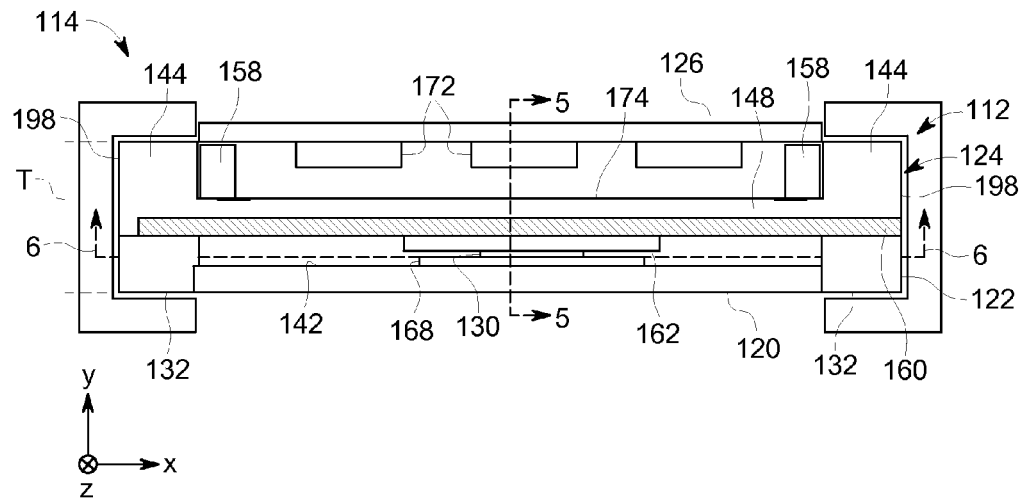
FIG. 4 is a schematic cross-sectional illustration of the circuit card assembly shown in FIG. 2 taken along Line 4-4.
Figure 5:
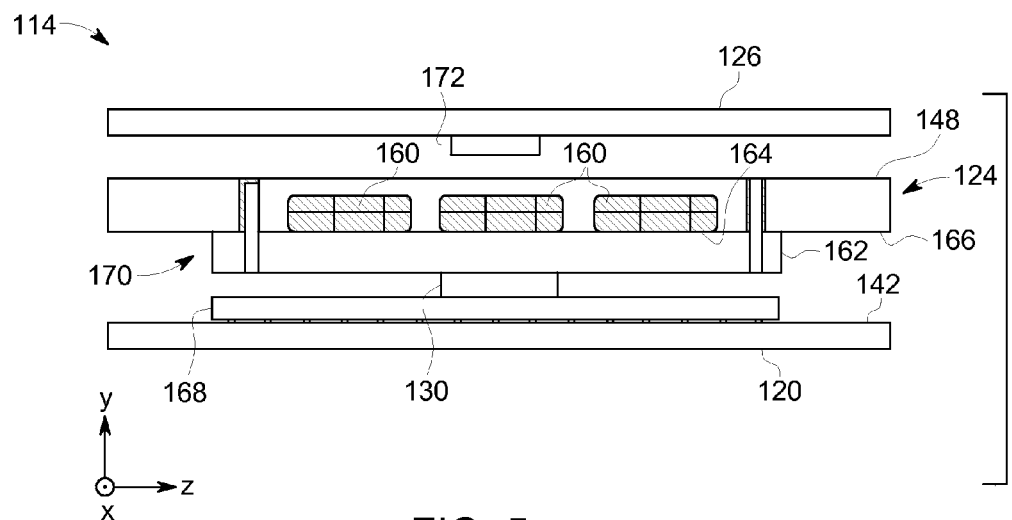
FIG. 5 is a schematic cross-sectional illustration of the circuit card assembly shown in FIG. 4 taken along Line 5-5.

FIG. 4 is a schematic cross-sectional illustration of CCA 114 taken along Line 4-4 (shown in FIG. 2), and FIG. 5 is a schematic cross-sectional illustration of CCA 114 taken along Line 5-5 (shown in FIG. 4). As described above, CCA 114 is slidably receivable in slots 112 of chassis housing 102. In the exemplary embodiment, first and second side rails 132 and 144 of frame 122 and heat transfer assembly 124 have a combined thickness T such that CCA 114 is coupled to housing 102 within slots 112 with an interference fit. Coupling heat transfer assembly 124 to housing 102 also facilitates transferring heat from side rails 144 towards housing 102 such that heat generated by processor 130 can be dissipated to ambient environment 119 (shown in FIG. 1).

As described above, a plurality of heat pipes 160 are coupled to first plate 148. As shown in FIGS. 4 and 5, heat pipes 160 are partially embedded within first plate 148 such that an exposed surface 164 of each heat pipe 160 is substantially coplanar with a first surface 166 of first plate 148, and such that exposed surface 164 is coupled directly to thermally conductive member 162. In the exemplary embodiment, heat pipes 160 have a substantially rectangular cross-sectional shape such that a width of each heat pipe 160 extending along Z-axis, as shown in FIG. 5, is greater than its thickness extending along Y-axis. As such, surface contact between exposed surfaces 164 and thermally conductive member 162 is increased. However, heat pipes 160 may have any cross-sectional shape that enables heat transfer assembly 124 to function as described herein. Moreover, in an alternative embodiment, heat pipes 160 are fully embedded within first plate 148 that is fabricated from thermally conductive material.

As described above, at least a portion of heat pipes 160 are substantially coplanar with first surface 166 of first plate 148. In one embodiment, heat pipes 160 extend from the substantially coplanar position along first side 154 of heat transfer assembly towards second side 156 of heat transfer assembly 124. Specifically, condenser portions (not shown in FIG. 5) of heat pipes 160 extend towards second side 156 while remaining at least partially embedded within second side rails 144 such that the condenser portion is positioned at a greater vertical distance along Y-axis from processor 130 than an evaporator portion (not shown in FIG. 5) of heat pipes 160. As such, heat can be more readily dissipated from the condenser portions of heat pipes 160 at the comparatively cooler second side 156 of heat transfer assembly 124.

In the exemplary embodiment, a substrate 168 is coupled to first PCB 120 and processor 130 is coupled to substrate 168. Moreover, a thickness of first side rails 132 is selected such that a gap 170 is defined between processor 130 and heat pipes 160 or first plate 148. The size of gap 170 can vary based on a distance along Y-axis that processor 130 extends from first surface 142 of first PCB 120. As such, thermally conductive member 162 has a thickness that extends through gap 170, and that facilitates ensuring heat is transferred from processor 130 towards heat pipes 160 via thermally conductive member 162. The thickness of thermally conductive member 162 is also selected to accommodate height differences in different processors 130. As such, in operation, heat generated by processor 130 is conducted through thermally conductive member 162 along Y-axis, through heat pipes 160 along X-axis and Y-axis, through second side rails 144, through housing 102, and towards ambient environment 119.

In some embodiments, second PCB 126 is coupled to heat transfer assembly 124, and a plurality of second components 172 are mounted on second PCB 126. As described above, secondary rails 158 are coupled between second PCB 126 and a second surface 174 of first plate 148 to facilitate transferring heat from second components 172 mounted on second PCB 126 towards first plate 148. Secondary rails 158 may be fabricated from any thermally conductive material that enables heat transfer assembly 124 to function as described herein. As such, in operation, heat generated by second components 172 is conducted through second PCB 126 along X-axis, through secondary rails 158 along Y-axis, through first plate 148 along Y-axis, and towards heat pipes 160.

Figure 6:
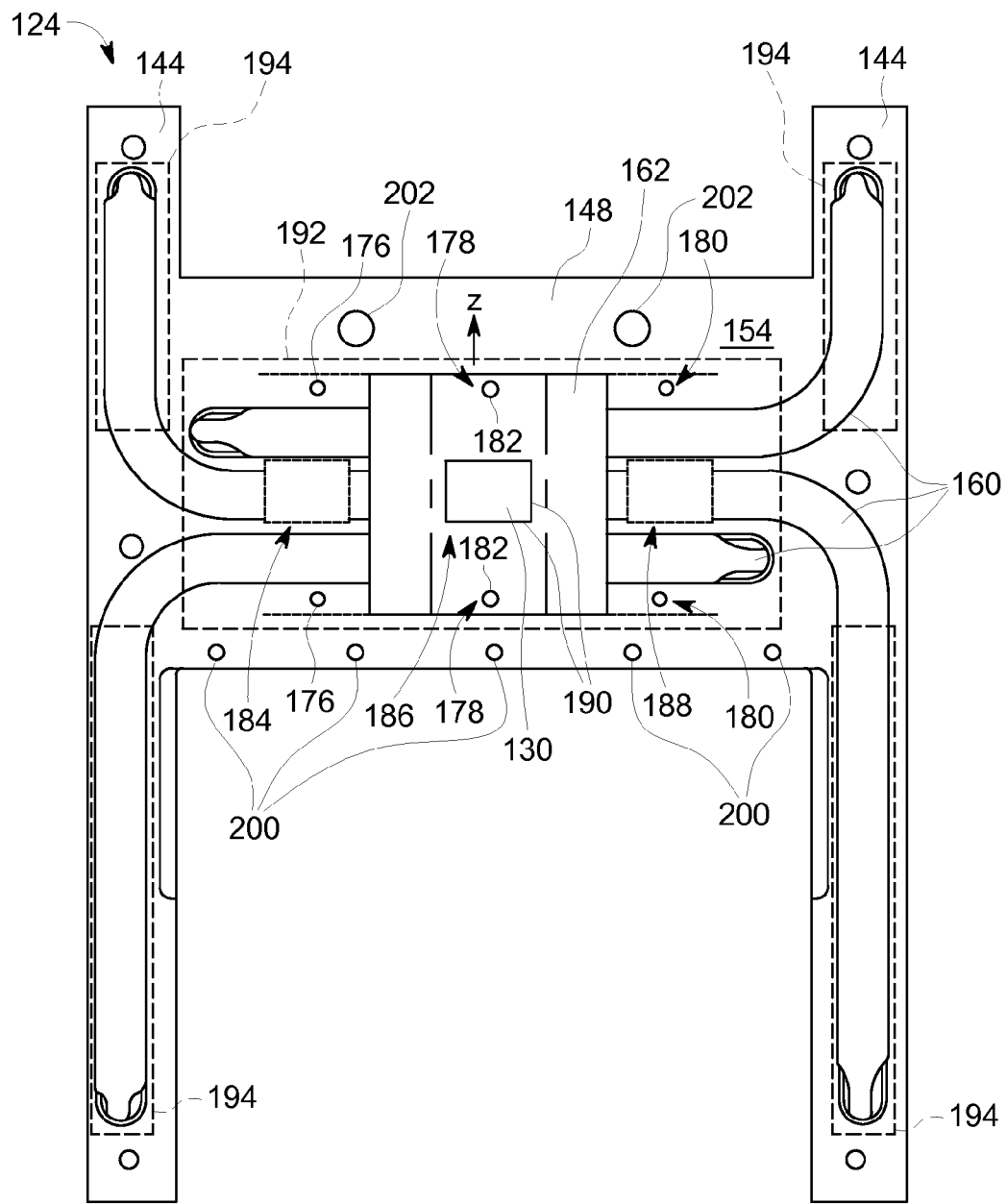
FIG. 6 is a schematic illustration of an exemplary heat transfer assembly shown in FIG. 4 taken along Line 6-6.

FIG. 6 is a schematic illustration of heat transfer assembly 124 taken along Line 6-6 (shown in FIG. 4). As described above, thermally conductive member 162 is selectively mounted at predetermined locations along first plate 148 based on a location of processor 130 mounted on first PCB 120 (shown in FIG. 4). For example, in the exemplary embodiment, a first pair 176 of mounting points, a second pair 178 of mounting points, and a third pair 180 of mounting points are defined along first plate 148. Thermally conductive member 162 includes complementary mounting apertures 182 that correspond with the pairs of mounting points such that thermally conductive member 162 is positionable at any of those locations. Similarly, processor 130 is positionable at a first potential location 184, a second potential location 186, or a third potential location 188. The first, second, and third potential locations 184, 186, and 188 substantially coincide with the first, second, and third pairs 176, 178, and 180 of mountings points, respectively. As such, a mounting location of thermally conductive member 162 on first plate 148 is selected such that enhanced heat transfer between processor 130 and thermally conductive member 162 occurs. In one embodiment, the mounting location is selected such that processor 130 is substantially centrally located relative to thermally conductive member 162.

Moreover, thermally conductive member 162 is sized to extend beyond outer edges 190 of processor 130. In some implementations, when a plurality of heat pipes 160 are coupled to first plate 148, thermally conductive member 162 is sized to extend across at least a portion of each heat pipe 160. For example, heat generated by processor 130 will generally only be transferred to fewer than the number of heat pipes 160 if processor 130 does not extend across at least a portion of each heat pipe 160. As such, the dimensions of thermally conductive member 162 are selected to ensure heat generated by processor will be at least partially transferred to each heat pipe 160.

Heat transfer assembly 124 also includes a plurality of attachment features that couple first plate 148 to first PCB 120. For example, a plurality of fastener apertures 200 are defined along second support rail 146. Fastener apertures 200 are sized such that fasteners can extend therethrough and couple to first PCB 120, and such that first plate 148 is indirectly coupled to first PCB 120 via second support rail 146. Heat transfer assembly 124 also includes PCB stand-offs 202 coupled to first plate 148. PCB stand-offs 202 extend between first plate 148 and first surface 142 of first PCB 120 such that first plate 148 is indirectly coupled to first PCB 120 via PCB stand-offs 202. The attachment features are located between second side rails 144 to ensure thermally conductive member 162 remains securely coupled to processor 130 during operation. More specifically, the attachment features compensate for any flexibility in first plate 148 in response to vibratory forces induced on CCA 114. In an alternative embodiment, PCB stand-offs 202 have any shape that enables CCA 114 to function as described herein.

In the exemplary embodiment, heat pipes 160 include evaporator portions 192 extending along first plate 148, and condenser portions 194 extending from first plate 148 towards side edges 198 of heat transfer assembly 124. Specifically, evaporator portions 192 are positioned adjacent to processor 130, and condenser portions 194 extend along second side rails 144 in a variety of different orientations. Extending condenser portions 194 along second side rails 144 facilitates increasing heat dissipation by positioning condenser portions 194 away from the sources of heat. Moreover, extending condenser portions 194 in a variety of orientations ensures heat transfer assembly 124 continues to function properly when external forces, such as G-forces, are exerted on CCA 114. For example, in some embodiments, chassis 100 is implemented in aircraft such as airplanes, unmanned aerial vehicles (UAVs), gliders, helicopters, and/or any other object that travels through airspace. G-forces exerted on CCA 114 during flight can impede movement of working fluid flowing through heat pipes 160, thereby reducing the heat transfer capability of an individual heat pipe 160. However, extending heat pipes 160 in a variety of orientations facilitates offsetting reduced heat transfer capability in heat transfer assembly 124 caused by counteractive G-forces. For example, reduced heat transfer capability of a heat pipe 160 extending in a first direction is offset when the G-forces simultaneously aid movement of working fluid in a heat pipe 160 extending in an opposing second direction.

Figure 7:
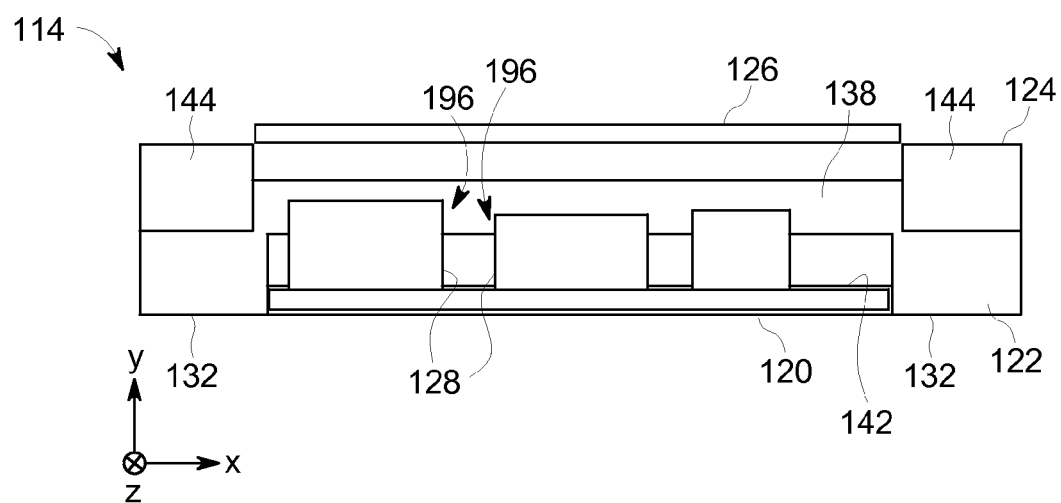
FIG. 7 is a schematic illustration of the circuit card assembly shown in FIG. 2 taken along Line 7-7.

FIG. 7 is a schematic cross-sectional illustration of CCA 114 taken along Line 7-7 (shown in FIG. 2). In the exemplary embodiment, second plate 138 extends over components 128 mounted on first PCB 120 and includes cutouts 196 substantially aligned with components 128 extending from first surface 142. Second plate 138 and, more specifically, cutouts 196 are modifiable to accommodate variations in a configuration of components 128 mounted on first PCB 120, a shape of components, and/or a distance that components 128 extend from first surface 142. For example, the shape of each cutout is selected to substantially conform with a shape of components 128 such that components 128 are at least partially received within second plate 138 when frame 122 is coupled to first PCB 120. As such, forming cutouts 196 in second plate 138 enables CCA 114 to remain substantially compact, and facilitates sizing CCA 114 for insertion within slots 112 (shown in FIG. 1.)

The assembly and methods described herein relate to circuit card assemblies and mechanisms for dissipating heat therefrom. Specifically, the circuit card assembly includes heat dissipation mechanisms that facilitate improving the thermal performance of the circuit card assembly. Such mechanisms include, but are not limited to, a modular thermally conductive member, improved heat pipe configurations, a second plate, and secondary rails. As such, the thermal performance of the circuit card assembly is improved, which facilitates enabling a processor or other electronic components having an increased power output to be mounted on the printed circuit board. Moreover, the the heat dissipation mechanisms are customizable based on a configuration and/or type of components mounted on the printed circuit boards.

An exemplary technical effect of the assemblies and methods described herein includes at least one of: (a) improving thermal performance of circuit card assemblies; (b) enabling processors having increased power outputs to be implemented in the circuit card assemblies; and (c) providing a customizable heat transfer assembly that is modifiable based on a location and/or dimensions of electronic components mounted on printed circuit boards.

Exemplary embodiments of the circuit card assembly are described above in detail. The assembly is not limited to the specific embodiments described herein, but rather, components of systems and/or steps of the methods may be utilized independently and separately from other components and/or steps described herein. For example, the circuit card assembly described herein may also be used in combination with other processes, and is not limited to practice with only printed circuit board and related methods as described herein. Rather, the exemplary embodiment can be implemented and utilized in connection with many applications where improved heat dissipation is desirable.

Although specific features of various embodiments of the present disclosure may be shown in some drawings and not in others, this is for convenience only. In accordance with the principles of embodiments of the present disclosure, any feature of a drawing may be referenced and/or claimed in combination with any feature of any other drawing.

This written description uses examples to disclose the embodiments of the present disclosure, including the best mode, and also to enable any person skilled in the art to practice embodiments of the present disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit card assembly comprising:
a first printed circuit board;
at least one electronic component mounted on said first printed circuit board at a predetermined location;
a frame coupled to said first printed circuit board; and
a heat transfer assembly coupled to said frame, wherein said heat transfer assembly comprises:
a first plate extending over at least a portion of said first printed circuit board;
a heat pipe coupled to said first plate; and
a thermally conductive member positioned between said at least one electronic component and said heat pipe, wherein said thermally conductive member is selectively mounted at predetermined locations along said first plate based on the predetermined location of said at least one electronic component.

2. The assembly in accordance with claim 1, wherein said heat pipe is partially embedded within said first plate thereby defining an exposed surface of said heat pipe, wherein said exposed surface is coupled to said thermally conductive member.

3. The assembly in accordance with claim 1, wherein said heat pipe comprises an evaporator portion and a condenser portion, said evaporator portion positioned adjacent said at least one electronic component and said condenser portion extending away from said at least one electronic component.

4. The assembly in accordance with claim 3, wherein said condenser portion is positioned at a greater distance from said at least one electronic component than from said evaporator portion.

5. The assembly in accordance with claim 1, wherein said heat transfer assembly further comprises a pair of side rails extending along said first plate, said heat pipe extending from said first plate and along at least one of said side rails.

6. The assembly in accordance with claim 1, wherein said heat pipe further comprises a plurality of heat pipes coupled to said first plate, said thermally conductive member is sized to extend across at least a portion of each heat pipe of said plurality of heat pipes.

7. The assembly in accordance with claim 1, wherein said at least one electronic component comprises outer edges, said thermally conductive member sized to extend beyond said outer edges of said at least one electronic component.

8. The assembly in accordance with claim 1, wherein said thermally conductive member has a thickness that extends through a gap defined between said at least one electronic component and said heat pipe.

9. The assembly in accordance with claim 1 further comprising:
a second printed circuit board, wherein said first printed circuit board is positioned on a first side of said heat transfer assembly and said second printed circuit board is positioned on a second side of said heat transfer assembly; and
at least one secondary rail thermally coupled between said second printed circuit board and said first plate.

10. An electronics system comprising:
a chassis; and
a circuit card assembly coupled to said chassis, said circuit card assembly comprising:
a first printed circuit board;
at least one electronic component mounted on said first printed circuit board at a predetermined location;

a frame coupled to said first printed circuit board; and a heat transfer assembly coupled to said frame and comprising:
- a first plate extending over at least a portion of said first printed circuit board;
- a heat pipe coupled to said first plate; and
- a thermally conductive member positioned between said at least one electronic component and said heat pipe, wherein said thermally conductive member is selectively mounted at predetermined locations along said first plate based on the predetermined location of said at least one electronic component.

11. The system in accordance with claim 10, wherein said heat pipe is partially embedded within said first plate thereby defining an exposed surface of said heat pipe, said exposed surface coupled to said thermally conductive member.

12. The system in accordance with claim 11, wherein a width of said heat pipe is greater than a thickness of said heat pipe.

13. The system in accordance with claim 10, wherein said heat pipe further comprises a plurality of heat pipes coupled to said first plate, said thermally conductive member sized to extend across at least a portion of each heat pipe of said plurality of heat pipes.

14. The system in accordance with claim 11, wherein said heat transfer assembly further comprises at least one attachment feature that couples said first plate to said first printed circuit board.

15. A method of manufacturing a circuit card assembly, said method comprising:
- coupling a frame to a first printed circuit board including at least one electronic component mounted thereon at a predetermined location;
- coupling a heat transfer assembly to the frame, the heat transfer assembly including a first plate extending over at least a portion of the first printed circuit board; and
- selectively mounting a thermally conductive member at predetermined locations along the first plate based on the predetermined location of the at least one electronic component.

16. The method in accordance with claim 15 further comprising coupling a heat pipe to the first plate such that the heat pipe is positioned between the first plate and the thermally conductive member.

17. The method in accordance with claim 16 further comprising partially embedding the heat pipe within the first plate thereby defining an exposed surface of the heat pipe, wherein the exposed surface is coupled to the thermally conductive member.

18. The method in accordance with claim 15, wherein the at least one electronic component includes outer edges, said method further comprising sizing the thermally conductive member to extend beyond the outer edges of the at least one electronic component.

19. The method in accordance with claim 15 further comprising sizing the thermally conductive member to have a thickness that extends through a gap defined between the at least one electronic component and the first plate.

20. The method in accordance with claim 15 further comprising:
- coupling a second printed circuit board to the heat transfer assembly; and
- thermally coupling a secondary rail between the second printed circuit board and the first plate.

* * * * *